United States Patent
Nakamura et al.

(10) Patent No.: US 9,418,916 B2
(45) Date of Patent: Aug. 16, 2016

(54) SEMICONDUCTOR DEVICE

(71) Applicant: FUJI ELECTRIC CO., LTD., Kawasaki-shi (JP)

(72) Inventors: Yoko Nakamura, Matsumoto (JP); Norihiro Nashida, Kita-asumi-gun (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/643,266

(22) Filed: Mar. 10, 2015

(65) Prior Publication Data

US 2015/0179551 A1    Jun. 25, 2015

Related U.S. Application Data

(63) Continuation of application No. PCT/JP2014/000371, filed on Jan. 24, 2014.

(30) Foreign Application Priority Data

Jan. 25, 2013  (JP) ................................ 2013-012261

(51) Int. Cl.
  *H01L 23/48* (2006.01)
  *H01L 25/07* (2006.01)
  (Continued)

(52) U.S. Cl.
  CPC ........ *H01L 23/481* (2013.01); *H01L 23/49811* (2013.01); *H01L 23/49844* (2013.01);
  (Continued)

(58) Field of Classification Search
  CPC ............ H01L 23/481; H01L 29/41708; H01L 29/408; H01L 25/18; H01L 2224/291; H01L 23/49844; H01L 2224/06051; H01L 2224/92242; H01L 2924/13055

USPC ........... 257/47, 164, 176, 197; 438/170, 189, 438/234, 612
  See application file for complete search history.

(56) References Cited

U.S. PATENT DOCUMENTS

2006/0192253 A1    8/2006  Okumura et al.
2009/0246910 A1*  10/2009  Taniguchi ........... H01L 23/5385
                                                        438/107
2012/0241953 A1    9/2012  Yamada et al.

FOREIGN PATENT DOCUMENTS

JP    2003188378 A    7/2003
JP    2006066704 A    3/2006
(Continued)

OTHER PUBLICATIONS

International Search Report issued in PCT/JP2014/000371, dated Mar. 18, 2014. English translation provided.

*Primary Examiner* — Jarrett Stark
*Assistant Examiner* — Shahed Ahmed
(74) *Attorney, Agent, or Firm* — Rossi, Kimms & McDowell LLP

(57) ABSTRACT

A semiconductor device including a semiconductor chip, a first electrode pad and second electrode pad included on one surface of the semiconductor chip, a first conductive post joined by a joining material to the first electrode pad, a plurality of second conductive posts joined by a joining material to the second electrode pad, and a printed substrate, disposed opposing the one surface of the semiconductor chip, on which is formed an electrical circuit to which the first conductive post and second conductive posts are connected. The second conductive posts on the side near the first conductive post are arrayed avoiding a short-circuit prevention region at a distance such that the joining material of the first conductive post and the joining material of the second conductive posts do not link.

15 Claims, 7 Drawing Sheets

(51) Int. Cl.
  *H01L 23/498* (2006.01)
  *H01L 29/40* (2006.01)
  *H01L 25/18* (2006.01)

(52) U.S. Cl.
  CPC ............ *H01L25/072* (2013.01); *H01L 29/408* (2013.01); *H01L 25/18* (2013.01); *H01L 2224/0401* (2013.01); *H01L 2224/06051* (2013.01); *H01L 2224/06181* (2013.01); *H01L 2224/11318* (2013.01); *H01L 2224/13111* (2013.01); *H01L 2224/16235* (2013.01); *H01L 2224/16238* (2013.01); *H01L 2224/291* (2013.01); *H01L 2224/32225* (2013.01); *H01L 2224/73253* (2013.01); *H01L 2224/81815* (2013.01); *H01L 2224/92242* (2013.01); *H01L 2924/10253* (2013.01); *H01L 2924/10272* (2013.01); *H01L 2924/1203* (2013.01); *H01L 2924/1305* (2013.01); *H01L 2924/13055* (2013.01); *H01L 2924/13091* (2013.01)

(56) References Cited

FOREIGN PATENT DOCUMENTS

| | | |
|---|---|---|
| JP | 2006237429 A | 9/2006 |
| JP | 2008186957 A | 8/2008 |
| JP | 2009064852 A | 3/2009 |
| JP | 2009231690 A | 10/2009 |
| JP | 2012129336 A | 7/2012 |
| WO | 2011083737 A1 | 7/2011 |

* cited by examiner

SEMICONDUCTOR DEVICE

CROSS-REFERENCE TO RELATED APPLICATIONS

This application is a continuation of International Application No. PCT/JP2014/000371, filed on Jan. 24, 2014, and is based on and claims priority to Japanese Patent Application No. JP 2013-012261, filed on Jan. 25, 2013. The disclosure of the Japanese priority application and the PCT application in their entirety, including the drawings, claims, and the specification thereof, are incorporated herein by reference.

BACKGROUND

1. Field

Embodiments of the present invention relate to a semiconductor device wherein an electrode of a semiconductor chip mounted on an insulating substrate inside a semiconductor device is electrically connected via a conductive post to a printed substrate sealed inside the semiconductor device.

2. Discussion of the Background

A semiconductor device in which is mounted a power semiconductor element such as an IGBT (Insulated Gate Bipolar Transistor) or power-FET (Field Effect Transistor) is used in power conversion devices, uninterruptible power supply devices, machine tools, industrial robots, and the like. A semiconductor device having copper blocks disposed on the front and back of an insulating substrate with a conductive pattern, an IGBT chip and diode chip disposed on the front side copper block, and the IGBT chip and diode chip and the printed substrate are connected by a plurality of implant pins, has been proposed as the semiconductor device (for example, refer to International Publication 2011/083737).

Also, a semiconductor device including at least one semiconductor element (semiconductor chip) joined onto a metal foil formed on an insulating plate, a printed substrate disposed opposing the semiconductor element (semiconductor chip), and a plurality of post electrodes that electrically connect at least one metal foil formed on first and second main surfaces of the printed substrate and at least one main electrode of the semiconductor element (semiconductor chip), has been proposed as another semiconductor device (for example, refer to Japanese Publication JP-A-2009-64852). The semiconductor device described in Japanese Publication JP-A-2009-64852 is a type of semiconductor module such that a main electrode of a semiconductor chip is electrically connected by a plurality of post electrodes (conductive posts), as shown in FIG. 12 and FIG. 13. A semiconductor module 201 has a structure such that an insulating substrate 202 and an implant printed substrate 203 (hereafter called simply a printed substrate) caused to oppose the insulating substrate 202 are integrated by sealing with an under filling material, resin material, or the like, 204. A plurality of semiconductor chips 205 are mounted on the insulating substrate 202.

Furthermore, the semiconductor module 201 is packaged with a resin case (not shown), and functions as, for example, a general-purpose IGBT module. The insulating substrate 202 includes an insulating plate 206, a metal foil 207 formed using a DCB (Direct Copper Bonding) method on the lower surface of the insulating plate 206, and a plurality of metal foils 208 formed, also using a DCB method, on the upper surface of the insulating plate 206. The semiconductor chips 205 are joined onto the metal foils 208 across a lead-free solder layer 209 of a tin (Sn)-silver (Ag) series.

Also, the printed substrate 203 is of a multilayer structure wherein, for example, a resin layer 213 is disposed in a central portion, metal foils 214 are formed by patterning on the upper surface and lower surface of the resin layer 213, and the metal foils 214 are covered by protective layers 215. A plurality of through holes 210 are provided in the printed substrate 203. A thin, tubular plating layer (not shown) that electrically connects the upper surface and lower surface metal foils 214 is provided inside the through holes 210, and cylindrical post electrodes (conductive posts) 211 are implanted across the tubular plating.

Furthermore, as shown in FIG. 12, the semiconductor chip 205 includes an emitter electrode pad 205a, disposed over a comparatively large area in a central portion of the upper surface, and a gate electrode pad 205b with a comparatively small area formed between the emitter electrode pad 205a and a front edge portion. Further, two rows of, for example, five each of the post electrodes (conductive posts) 211 are joined in parallel to the emitter electrode pad 205a. Also, one post electrode (conductive post) 212 is joined to the gate electrode pad 205b. Also, as a large amount of heat is generated in a large current semiconductor chip mounted in a semiconductor device, various measures are taken in order to equalize the semiconductor chip temperature distribution. For example, there has been proposed a semiconductor device that is a large current semiconductor device affected by local distribution of the resistance of an upper electrode layer, wherein temperature rise distribution is fixed depending on the planar distribution conditions of a plurality of connection portions inside the upper electrode layer, and semiconductor chip temperature distribution is equalized by the connection portions being disposed in a zigzag form (for example, refer to Japanese Publication JP-A-2006-66704).

Also, there has been proposed a semiconductor device wherein, by an electrode member such that copper posts are formed in a plurality of through holes provided in a ceramic support body being joined by solder to a surface side on which an IGBT emitter electrode is formed, and the plurality of copper posts being joined by solder to the emitter electrode, heat generated in the IGBT moves to the electrode member and is released and, even when there is a difference in thermal expansion coefficient between the material configuring the IGBT and the copper, the stress exerted on the solder joint interface is reduced, thus keeping distortion small, and reducing the occurrence of cracks (for example, refer to Japanese Publication JP-A-2006-237429). The semiconductor device described in Japanese Publication JP-A-2006-237429 is such that the sectional area (diameter) of the copper posts in a central portion of the support body is greater than the diameter of the copper posts in a peripheral portion, the copper posts with the greater sectional area are formed in the central portion, which has low thermal stress, and a large number of the copper posts with the smaller sectional area are disposed in the peripheral portion, which has high thermal stress. Because of this, the solder layer is thickened, and the occurrence of cracks at the solder joint interface is suppressed.

Further, there has also been proposed a semiconductor device such that temperature rise in the central portion of a surface electrode with inferior heat releasing properties is suppressed using a method whereby the combined resistance reaching from a semiconductor element to the central portion of the surface electrode and, via a metal wire, to an external electrode is set to be larger than the combined resistance reaching from the semiconductor element to a peripheral portion of the surface electrode and, via a metal wire, to an external electrode, or by a metal wire being joined only to the peripheral portion of the surface electrode, or the like, in order to suppress temperature rise in the central portion of the surface electrode with inferior heat releasing properties, (for example, refer to Japanese Publication JP-A-2003-188378). Furthermore, there has also been proposed a semiconductor device such that a power semiconductor device such as an IGBT is a semiconductor device that, in order to equalize temperature distribution due to heat generation on a chip surface, includes electrodes on the front and back chip surfaces of a semiconductor chip such as an IGBT, wherein current flows between the electrode on one chip surface and the electrode on the other chip surface when an on-state operation is carried out, a plurality of wires are connected with a non-uniform disposition distribution to the electrode on the one chip surface of the semiconductor chip and, based on a predetermined reference, the number of wires connected to a peripheral portion of the one chip surface is greater than the number of wires connected to a central portion of the one chip surface (for example, refer to Japanese Publication JP-A-2008-186957).

SUMMARY OF THE INVENTION

However, the existing examples described in the publications noted above are such that, focusing on semiconductor chip temperature rise, conductive posts are simply joined to an electrode on one surface of a semiconductor chip, and absolutely no consideration is given to a short-circuit caused by solder between electrode pads when two or more electrode pads are disposed on one surface of a semiconductor chip. That is, to give a description of the semiconductor device described in, for example, Japanese Publication JP-A-2009-64852, the semiconductor chip 205 is mounted across the solder 209 on the metal foil 208 formed on the upper surface of the insulating substrate 202, as shown in FIG. 12 and FIG. 13. Two rows of five each of the post electrodes (conductive posts) 211 are joined in parallel to the emitter electrode pad 205a of the semiconductor chip 205, and one post electrode (conductive post) 212 is joined to the gate electrode pad 205b disposed between the emitter electrode pad 205a and an end face. Because of this, the intervals between the post electrodes 211 joined to the emitter electrode pad 205a and the post electrode 212 joined to the gate electrode pad 205b decrease. Consequently, the volume of solder between the emitter electrode pad 205a and gate electrode pad 205b due to fillets formed at each of the post electrodes 211 and 212 when joining the two post electrodes 211 and 212 with solder is liable to increase, and there is concern about the formation of a bridge wherein the solder is in a state such as not to separate to the individual electrode pad sides. Because of this, it may happen that connection failure occurs due to a short-circuit between the emitter electrode pad 205a and gate electrode pad 205b.

Also, in the same way, there is an unresolved problem in that, when a large positional deviation occurs between the semiconductor chip 205 and insulating substrate 202, or between the semiconductor chip 205 and the printed substrate 203 in which the post electrodes 211 and 212 are fixed, there is concern that the post electrode corresponding to each electrode pad, rather than being disposed in the fixed position, may be joined to the wrong electrode pad, whereby connection failure occurs between the emitter electrode pad 205a and gate electrode pad 205b. Also, when using a solid phase diffusion joining material such as metal particles typified by nano-Ag or the like, it may happen that the joining material spreads in the horizontal plane due to a process such as pressurization when joining, because of which, in the same way as with the solder, there is an unresolved problem in that it may happen that the joining material on individual electrode pads of the semiconductor chip comes into contact, and connection failure due to a short-circuit occurs.

Furthermore, a wide bandgap (WBG) device typified by an SiC semiconductor or the like, the application of which is increasing recently, is such that, taking into account the yield rate due to wafer defects, it is necessary to increase volume by attempting multichip mounting of a small semiconductor chip of in the region of 2 mm to 5 mm square. The small semiconductor chip is such that positioning between a DCB substrate and the semiconductor chip, and of the semiconductor chip and a printed substrate having conductive posts, is difficult compared with when using the existing Si, and joining of a predetermined electrode pad and a conductive post is difficult, on top of which, as parallel connection is carried out using a large number of semiconductor chips, there is an unresolved problem in that it is predicted that it will be difficult to improve the module yield rate when the heretofore described kind of semiconductor chip connection failure occurs. Therefore, embodiments of the invention provide a semiconductor device that may improve the mounting quality of each semiconductor chip.

A semiconductor device according to an embodiment of the invention includes a semiconductor chip, a first electrode pad and second electrode pad included on one surface of the semiconductor chip, a first conductive post joined by a joining material to the first electrode pad, a plurality of second conductive posts joined by a joining material to the second electrode pad, and a printed substrate, disposed opposing the one surface of the semiconductor chip, on which is formed an electrical circuit to which the first conductive post and second conductive posts are connected. Further, the second conductive posts on the side near the first conductive post are arrayed avoiding a short-circuit prevention region at a distance such that the joining material of the first conductive post and the joining material of the second conductive posts do not link. The gap between the first electrode pad and second electrode pad is determined after considering the diameters of the first conductive post and second conductive posts, the widths of the first electrode pad and second electrode pad, the amount of solder, and the like. Generally, it is desirable that the gap is 50 μm or more, 200 μm or less, while 100 μm is more desirable.

According to embodiments of the invention, when having a first conductive post and a plurality of second conductive posts individually joined by a joining material to a first electrode pad and second electrode pad included on one surface of a semiconductor chip, the second conductive posts on the side near the first conductive post are arrayed avoiding a short-circuit prevention region at a distance such that the joining material of the first conductive post and the joining material of the second conductive posts do not link, because of which it is possible to reliably prevent the first conductive post and the second conductive posts on the side near the first conductive post from being short-circuited by the joining material. Consequently, it is possible to improve the mounting quality of each semiconductor chip.

BRIEF DESCRIPTION OF DRAWINGS

FIG. 7 is a plan view of a semiconductor chip showing a third embodiment of the invention, where

FIG. 9 is a plan view of a semiconductor chip showing a fifth embodiment of the invention, wherein

DETAILED DESCRIPTION OF ILLUSTRATED EMBODIMENTS

Figure 1:
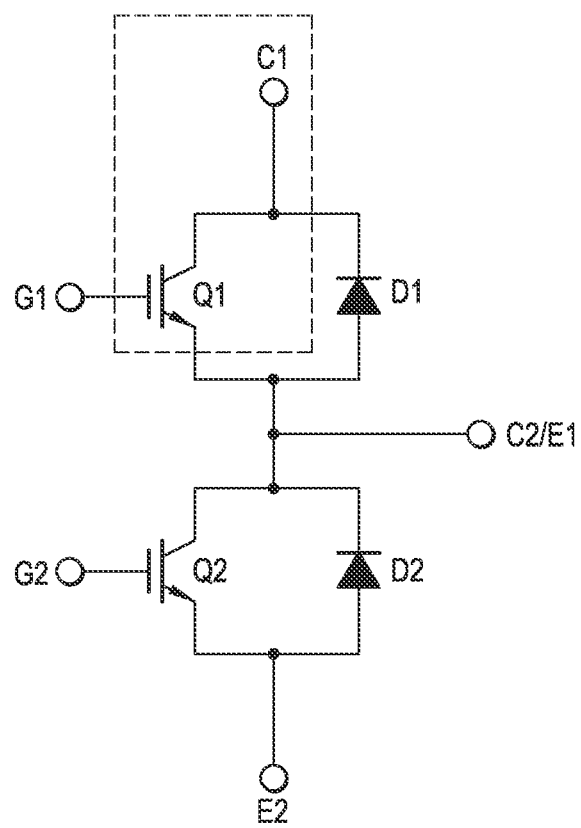
FIG. 1 is a circuit diagram showing an example of an equivalent circuit in a semiconductor device according to an embodiment of the invention.

Hereafter, referring to the drawings, a description will be given of an example of embodiments of the invention. FIG. 1 is a circuit diagram showing an example of an equivalent circuit in a semiconductor device according to an embodiment of the invention. The semiconductor device includes a first transistor Q1, a first diode D1, a second transistor Q2, a second diode D2, a first collector terminal C1, a first gate terminal G1, a second gate terminal G2, an intermediate terminal C2/E1, and a second emitter terminal E2. The collector of the first transistor Q1 and the cathode of the first diode D1 are electrically connected, while the emitter of the first transistor Q1 and the anode of the first diode D1 are electrically connected. The collector of the second transistor Q2 and the cathode of the second diode D2 are electrically connected, while the emitter of the second transistor Q2 and the anode of the second diode D2 are electrically connected.

The first collector terminal C1 is electrically connected to the collector of the first transistor Q1 and the cathode of the first diode D1. The first gate terminal G1 is electrically connected to the gate of the first transistor Q1. The second gate terminal G2 is electrically connected to the gate of the second transistor Q2. The intermediate terminal C2/E1 is electrically connected to the emitter of the first transistor Q1, the anode of the first diode D1, the collector of the second transistor Q2, and the cathode of the second diode D2. The second emitter terminal E2 is electrically connected to the emitter of the second transistor Q2. The semiconductor device of the invention is such that a switching device such as, for example, an IGBT or power MOSFET is used for the first transistor Q1 and second transistor Q2. The first diode D1 and second diode D2 are used as free wheeling diodes.

Figure 2:
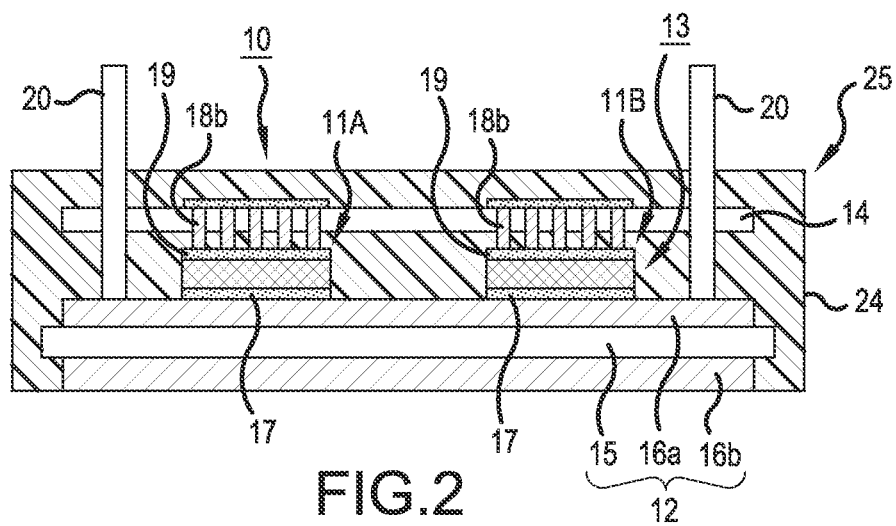
FIG. 2 is a sectional view showing a first embodiment of the invention.

FIG. 2 is a sectional view showing a first embodiment of the invention. A transistor for a power semiconductor device with a large rated current is such that a process whereby semiconductor chips with a small rated current are used in parallel, thus increasing the rated current of the whole, is carried out. FIG. 2 shows the portion of the first transistor Q1 and first collector terminal C1 shown by the broken lines in FIG. 1 as two semiconductor elements 11A and 11B and two pin-form conductors 20 formed in parallel. An insulating substrate 12 is configured of a ceramic substrate 15 of alumina, or the like, with good heat conductivity, and copper plates 16a and 16b individually attached to the front and back surfaces of the ceramic substrate 15. A predetermined semiconductor circuit 13 for connecting a plurality of power devices disposed on the copper plate 16a is formed on the copper plate 16a on the front surface side of the insulating substrate 12. Although not shown in FIG. 2, a control electrode pad 11a and emitter electrode pad 11b are formed on the front surfaces of the semiconductor chips 11A and 11B, and collector electrode pads are formed one each on the back surfaces of the semiconductor chips 11A and 11B in positions opposing the front surface emitter electrode pads 11b. Further, the copper plate 16a of the insulating substrate 12 is such that each collector electrode pad on the back surfaces of the semiconductor chips 11A and 11B is electrically connected via solder 17. The semiconductor chips 11A and 11B may be formed of silicon substrates, or may be formed of SiC substrates.

The pin-form conductors 20 (first collector terminal C1) are electrically connected to the copper plate 16a of the insulating substrate 12. A printed substrate 14 configuring a wiring circuit is included above the semiconductor chips 11A and 11B, separated by a predetermined distance from the upper surfaces of the semiconductor chips 11A and 11B. A first conductive post 18a is electrically connected via solder 19 to the control electrode pad 11a and the wiring circuit of the printed substrate 14. A plurality of second conductive posts 18b are electrically connected via the solder 19 to the emitter electrode pad 11b and the wiring circuit of the printed substrate 14. In a state wherein one end of the pin-form conductors 20 (first collector terminal C1) and the copper plate 16b on the back surface of the insulating substrate 12 are exposed to the exterior, a resin sealing material 24 seals the insulating substrate 12, semiconductor chips 11A and 11B, control electrode pads 11a, emitter electrode pads 11b, collector electrode pads, pin-form conductors 20 (first collector terminal C1), first conductive posts 18a, second conductive posts 18b, printed substrate 14, and the like.

FIG. 2 shows a state wherein the semiconductor chips 11A and 11B configuring the first transistor Q1, and a semiconductor chip (not shown) configuring the first diode D1 behind the semiconductor chips 11A and 11B, are disposed in a front-back direction on the copper plate 16a of the insulating substrate 12. That is, the first transistor Q1 and first diode D1 are connected in anti-parallel by the copper plate 16a of the insulating substrate 12 and the printed substrate 14. As heretofore described, one first conductive post 18a and a plurality of the second conductive posts 18b are disposed extending downward from the back surface, which is one surface, of the printed substrate 14. The pin-form conductors 20 (first collector terminal C1) are disposed pointing upward in the insulating substrate, penetrate the printed substrate 14, and are led out to the exterior. It is also possible for the semiconductor chips 11A and 11B to be disposed aligned in a front-back direction on the copper plate 16a of the insulating substrate 12, as in FIG. 1, rather than in a left-right direction.

Figure 3:
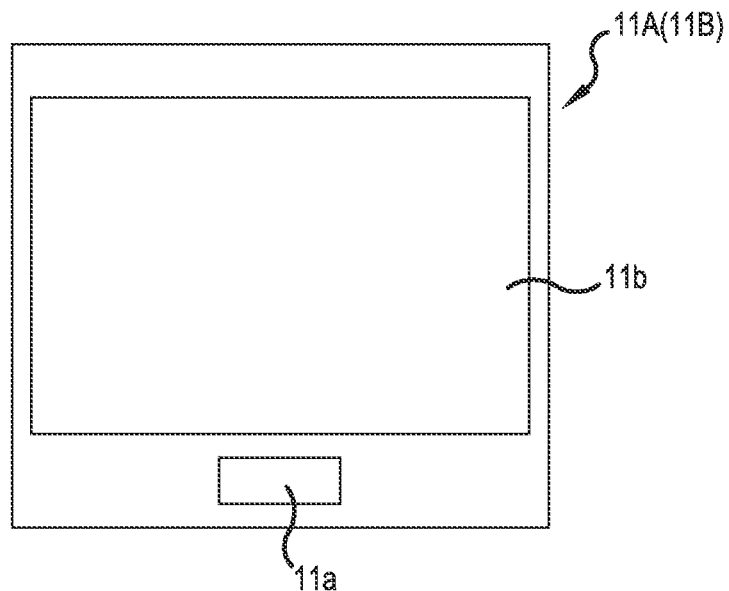
FIG. 3 is a plan view of a semiconductor chip of the first embodiment of the invention.
Figure 4:
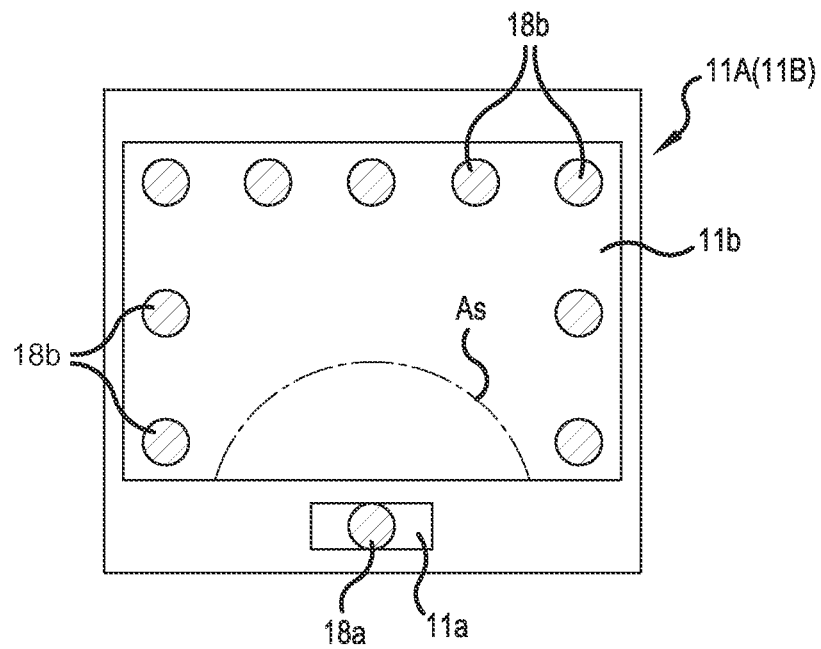
FIG. 4 is a plan view of the semiconductor chip of the first embodiment of the invention in a state wherein conductive posts are joined.

As shown in FIG. 3, the control electrode pad 11a, which has a comparatively small area, is formed on the front surface sides of the semiconductor chips 11A and 11B, and the emitter electrode pad 11b, which has a comparatively large area, is formed in central portions of the semiconductor chips 11A and 11B. The control electrode pad 11a fulfils the role of a base electrode as the first electrode pad. The emitter electrode pad 11b corresponds to the second electrode pad. FIG. 4 shows an example of the disposition of the first conductive post 18a on the control electrode pad 11a and the second conductive posts 18b on the emitter electrode pad 11b. In FIG. 4, one first conductive post 18a and nine second conductive posts 18b are used. The emitter electrode pad 11b is electrically connected to a pin-form conductor (pin terminal) configuring an unshown external connection terminal (the emitter terminal E1) via the printed substrate 14.

A semi-circular short-circuit prevention region As prohibiting the joining of conductive posts is set in the emitter electrode pads 11b of the semiconductor chips 11A and 11B, in a region in the vicinity of the first conductive post 18a joined to the control electrode pad 11a, centered on the center of the first conductive post 18a in a state where, for example, the first conductive post 18a is joined to the center of the control electrode pad 11a. The short-circuit prevention region As may be set in a semi-circular form having a radius equal to or greater than a radius of an extent that, when fillets are formed individually for the neighboring first conductive post 18a and second conductive posts 18b when the second conductive posts 18b are joined by, for example, solder acting as a joining member, can prevent a bridge from being formed by the two fillets linking with each other. The short-circuit prevention region As may be set to a radius such that the fillets formed for each of the first conductive post 18a and the second conductive posts 18b nearest the first conductive post 18a do not link with each other when the relative displacement in a horizontal plane of the setting positions of the semiconductor chips 11A and 11B on the copper plate 16a of the insulating substrate 12 and the setting position of the printed substrate 14 having the first conductive post 18a and second conductive posts 18b is of the maximum allowable value.

Consequently, the second conductive posts 18b fixed in the printed substrate 14 are positioned in the printed substrate 14, and fixed with a joining member such as, for example, solder, so as to be arrayed outside the short-circuit prevention region As on the emitter electrode pad 11b of the semiconductor chips 11A and 11B, and along a peripheral portion of the emitter electrode pad 11b. That is, the second conductive posts 18b are arrayed in, for example, a reverse U-shape seen in plan view, positioned, and fixed in the printed substrate 14 so that the state in which the second conductive posts 18b are joined to the emitter electrode pad 11b is a state wherein a central portion and the control electrode pad 11a side are opened, as shown in FIG. 4. Further, each component of a power semiconductor module 10 may be molded and protected by the resin sealing material 24, which is formed of, for example, an epoxy resin material of a thermosetting resin. As a result of this, the external form of the power semiconductor module 10 may be formed overall as a cuboid molded body 25 forming a rectangular form when seen in plan view. At this time, the copper plate 16b on the back surface side of the insulating substrate 12 is such that the lower surface thereof is flush with the bottom surface of the molded body 25, or protrudes slightly from the bottom surface.

Figure 5A:
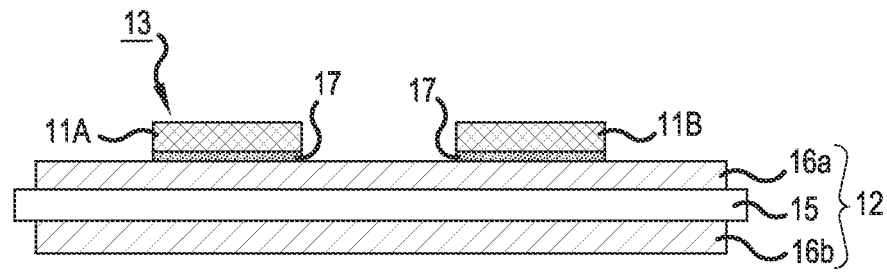
FIGS. 5A, 5B, and 5C are diagrams illustrating a method of manufacturing the semiconductor device of the first embodiment of the invention.
Figure 5B:
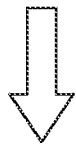
Figure 5B:
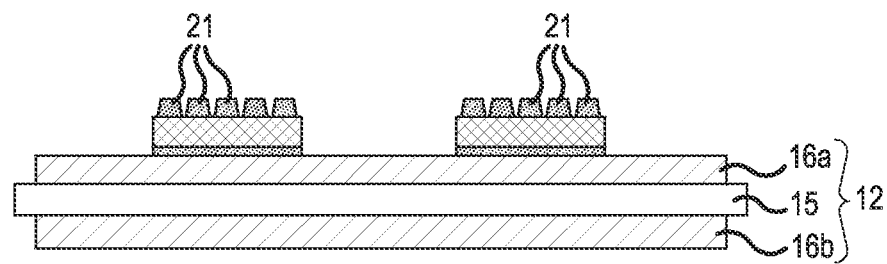

Next, a description will be given, accompanying FIG. 5, of a method of manufacturing a power semiconductor module according to an embodiment of the invention. Although not shown in FIG. 5, the control electrode pad 11a and first conductive post 18a are described in the following text. Firstly, as shown in FIG. 5A, the semiconductor chips 11A and 11B are mounted on the copper plate 16a of the insulating substrate 12 using the joining material 17, such as solder or the like. Next, as shown in FIG. 5B, a joining material 21 is applied onto the control electrode pad 11a and emitter electrode pad 11b in the semiconductor chips 11A and 11B mounted on the insulating substrate 12, in a position on the control electrode pad 11a to which the first conductive post 18a is joined, and in positions on the emitter electrode pad 11b to which the second conductive posts 18b are joined.

For example, when a paste-form solder (joining material) 21 that performs liquid phase joining is used as the joining material 21, the paste-form solder (joining material) 21 is partially applied using a dispenser or the like. The amount of the paste-form solder 21 applied is such that the paste-form solder 21 is applied so as to be a volume corresponding to a predetermined solder thickness after the first conductive post 18a and second conductive posts 18b are joined onto the control electrode pad 11a and emitter electrode pad 11b. A high temperature lead-free solder is used as the solder used in the manufacture of a semiconductor device in which a wide bandgap (WBG) device is used, as it is compatible with the high temperature operation of the wide bandgap (WBG) device. Specifically, an SnAgCuNiGe series solder, an SnAg series solder such as an Sn 3.5% Ag solder, an SnSb series solder such as an Sn 5% Sb solder, an SnAgCu series solder, an SnAgBi series solder, an SnCuBi series solder, An SnCu series solder, an SnAu series solder, an AuSi series solder, an AgSi series solder, an AgGe series solder, or the like, is appropriate. As there is concern about a drop in leakage as a characteristic of these high temperature lead-free solders, the second conductive posts 18b in the vicinity of the control electrode pad 11a are disposed outside the short-circuit prevention region As so as not to allow a bridge to be formed.

Figure 5C:
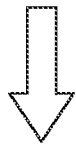
Figure 5C:
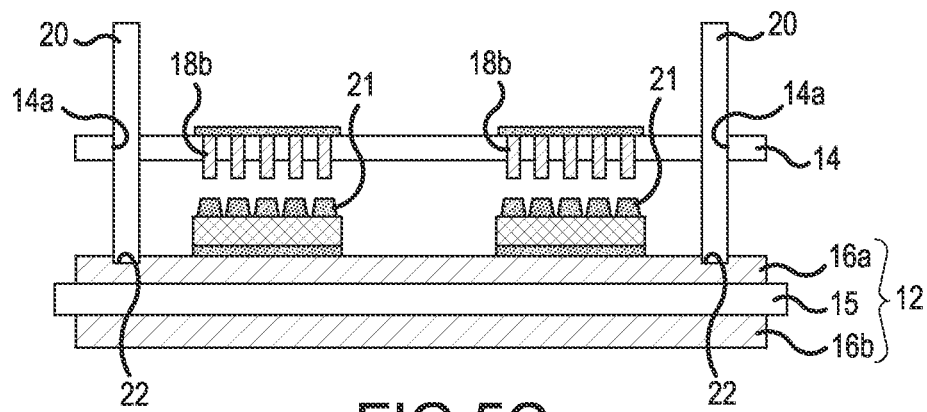

Next, as shown in FIG. 5C, the pin-form conductors (pin terminals) 20 acting as external connection terminals (the collector terminal C1) are fitted inside fitting holes 22 formed in the copper plate 16a of the insulating substrate 12. Next, the pin-form conductors 20 are inserted through through holes 14a formed in the printed substrate 14, and the printed substrate 14 is lowered from above the semiconductor chips 11A and 11B, with the pin-form conductors 20 as a guide. Further, the first conductive post 18a and second conductive posts 18b fixed in the printed substrate 14 are introduced into a reflow furnace in a state wherein the first conductive post 18a and second conductive posts 18b are in contact with the paste-form solder 21, and a reflow process is carried out. By so doing, the first conductive post 18a and second conductive posts 18b are joined to the control electrode pads 11a and emitter electrode pads 11b.

As the short-circuit prevention region As is set in the emitter electrode pad 11b of each of the semiconductor chips 11A and 11B, no conductive post 18b is joined inside the short-circuit prevention region As. Because of this, it is possible to secure an interval between the first conductive post 18a joined to the control electrode pad 11a and second conductive posts 18b neighboring the first conductive post 18a sufficient that fillets generated when soldering do not link with each other. Consequently, it is possible to reliably prevent the fillet formed for the first conductive post 18a and the fillets formed for the second conductive posts 18b nearest the first conductive post 18a from forming a bridge state, and thus possible to reliably prevent a short-circuit between the control electrode pad 11a and emitter electrode pad 11b. Subsequently, the joined insulating substrate 12, semiconductor chips 11A and 11B, and printed substrate 14 are molded by the resin sealing material 24, which is formed of an epoxy resin material of a thermosetting resin, whereby the power semiconductor module 10 acting as a semiconductor device is formed.

In this way, according to the first embodiment, when the plurality of electrode pads 11a and 11b are formed on one surface of the semiconductor chips 11A and 11B, the short-circuit prevention region As is formed in a region in the vicinity of the control electrode pad 11a of the electrode pad 11b, to which a large number of the second conductive posts 18b are joined. Because of this, when the first conductivity posts 18a and second conductivity posts 18b are soldered to the electrode pads 11a and 11b, it is possible to secure an interval between the first conductive post 18a and the second conductive posts 18b neighboring the first conductive post 18a sufficient that fillets formed when soldering do not link. Consequently, it is possible to reliably prevent the occurrence of a bridge state wherein fillets link between the first conductive post 18a and the second conductive posts 18b, possible to reliably prevent a short-circuit between the electrode pad 11a and electrode pad 11b, and thus possible to avoid the occurrence of a connection failure. Because of this, it is possible to improve the mounting quality of each semiconductor chip of the power semiconductor module 10, and thus possible to ensure the reliability of the power semiconductor module 10.

Moreover, as the number of second conductive posts 18b in the peripheral portion is set to be large with respect to the number of second conductive posts 18b in the central portion, it is possible to avoid deterioration due to cracks or the like in the central portion of the semiconductor chip, which is easily affected by heat during a power cycle reliability test, and thus possible to provide a power semiconductor module with a long lifespan. In the first embodiment, a description has been given of a case wherein the electrode pads 11a and 11b of the semiconductor chips 11A and 11B, and the first conductive posts 18a and second conductive posts 18b fixed in the printed substrate 14, are each soldered, but this is not limiting. That is, it is possible to apply a solid phase diffusion joining material using metal particles, typified by nano-Ag, as the joining material in place of solder.

When applying a solid phase diffusion joining material as the joining material in this way, the solid phase diffusion joining material is partially applied, using a dispenser or the like, in positions on the semiconductor chips 11A and 11B to which the first conductive posts 18a and second conductive posts 18b are joined. Further, in a state wherein the first conductive posts 18a and second conductive posts 18b fixed in the printed substrate 14 are brought into contact on the solid state diffusion joining material, the first conductive posts 18a and second conductive posts 18b are electrically joined by heating and pressurizing to the electrode pads 11a and 11b across the solid state diffusion joining material. The method of manufacturing the power semiconductor module 10 using a solid state diffusion joining material in this way is also such that the short-circuit prevention region As is formed on the semiconductor chips 11A and 11B. Because of this, when the solid state diffusion joining material spreads in a horizontal plane owing to a process such as pressurized thermal joining, the solid state diffusion joining material applied on differing electrode pads on the semiconductor chips 11A and 11B does not come into contact, and it is thus possible to avoid connection failure caused by a short-circuit of the joining material.

Figure 6:
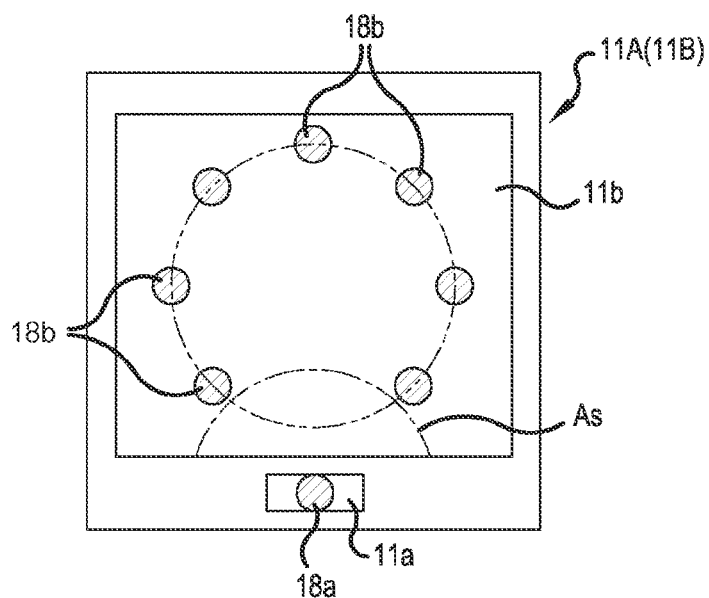
FIG. 6 is a plan view of a semiconductor chip showing a second embodiment of the invention.

Next, a description will be given, accompanying FIG. 6, of a second embodiment of the invention. The second embodiment is such that the plurality of second conductive posts 18b are arrayed in an arc form. That is, in the second embodiment, the second conductive posts 18b are disposed in an arc form, a C-form for example, in outer positions on the emitter electrode pad 11b, except inside the semi-circular short-circuit prevention region As, as shown in FIG. 6. According to the second embodiment, the second conductive posts 18b disposed on the emitter electrode pad 11b are arrayed in an arc form on the outer side, avoiding the semi-circular short-circuit prevention region As, because of which it is possible to obtain the same operational advantages as in the first embodiment.

Figure 7A:
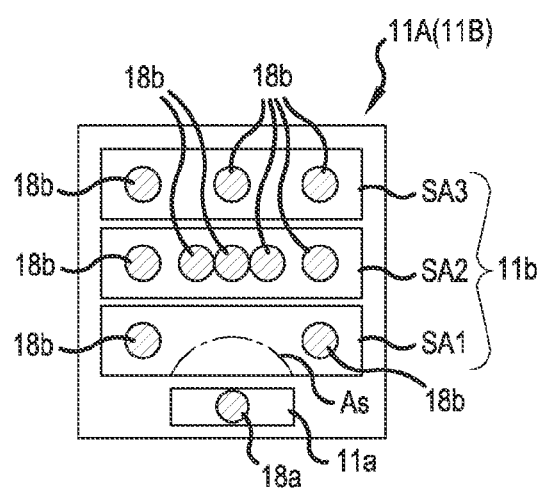
FIG. 7A shows an example wherein the interval between conductive posts in an intermediate sub-region is set to be smaller than the interval between conductive posts in an outer sub-region.
Figure 7B:
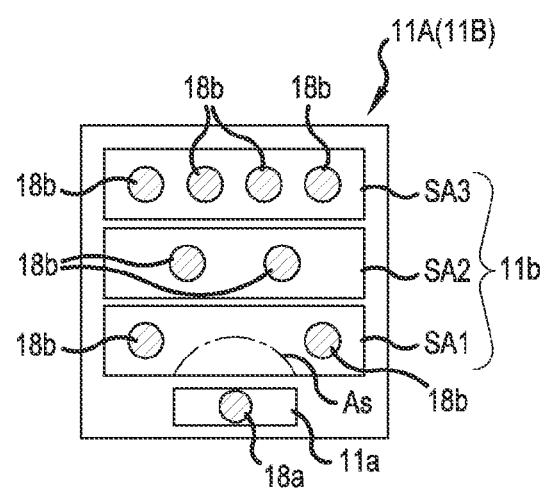
FIG. 7B shows an example wherein the interval between conductive posts in the intermediate sub-region is set to be greater than the interval between conductive posts in the outer sub-region.

Next, a description will be given, accompanying FIG. 7A and FIG. 7B, of a third embodiment of the invention. The third embodiment is such that the emitter electrode pads 11b of the semiconductor chips 11A and 11B are divided in a direction away from the control electrode pad 11a. That is, in the third embodiment, the emitter electrode pads 11b of the semiconductor chips 11A and 11B are divided into, for example, three sections, in a backward direction away from the control electrode pad 11a, forming an inner sub-region SA1, an intermediate sub-region SA2, and an outer sub-region SA3, as shown in FIG. 7A and FIG. 7B. Further, in the example of FIG. 7A, one of the second conductive posts 18b is disposed on each of left and right end sides, which form outer positions avoiding the short-circuit prevention region As, in the inner sub-region SA1. Also, in the intermediate sub-region SA2, one of the second conductive posts 18b is disposed on each of left and right sides corresponding to the second conductive posts 18b of the inner sub-region SA1, and three of the second conductive posts 18b are disposed so as to be in contact with each other in a central portion. Furthermore, in the outer sub-region SA3, three of the second conductive posts 18b are disposed corresponding to the second conductive posts 18b on the left and right sides of the intermediate sub-region SA2 and the second conductive post 18b in the left-right direction central portion.

Also, in the example of FIG. 7B, one of the second conductive posts 18b is disposed on each of left and right end sides, which form outer positions avoiding the short-circuit prevention region As, in the inner sub-region SA1. Also, in the intermediate sub-region SA2, one of the second conductive posts 18b is disposed in each of left and right positions farther toward the center than the second conductive posts 18b of the inner sub-region SA1. Furthermore, in the outer sub-region SA3, one of the second conductive posts 18b is disposed on each of left and right end sides corresponding to the second conductive posts 18b on the left and right sides of the inner sub-region SA1, and two of the second conductive posts 18b are disposed therebetween at equal intervals. According to the third embodiment, the emitter electrode pads 11b of the semiconductor chips 11A and 11B are divided into three sections in a backward direction away from the control electrode pad 11a, forming the inner sub-region SA1, intermediate sub-region SA2, and outer sub-region SA3, and the second conductive posts 18b are disposed in outer positions avoiding the short-circuit prevention region As in each of the sub-regions SA1 to SA3, because of which it is possible to obtain the same operational advantages as in the first and second embodiments.

Figure 8:
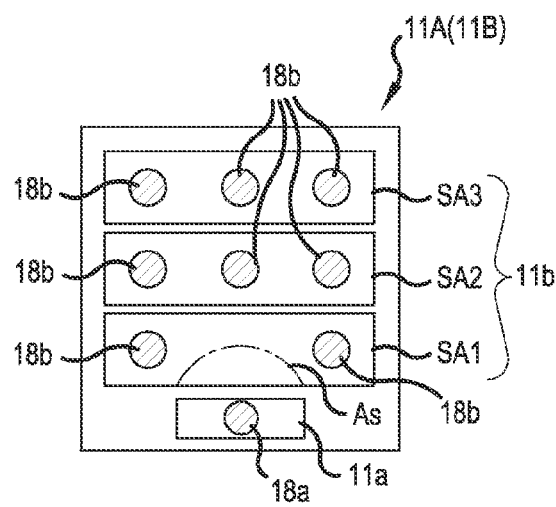
FIG. 8 is a plan view of a semiconductor chip showing a fourth embodiment of the invention.

Next, a description will be given, accompanying FIG. 8, of a fourth embodiment of the invention. The fourth embodiment is such that bias in the amount of heat generated in the sub-regions is prevented. That is, in the fourth embodiment, as shown in FIG. 8, the emitter electrode pads 11b of the semiconductor chips 11A and 11B are divided into three sections—the inner sub-region SA1, intermediate sub-region SA2, and outer sub-region SA3—in the same way as in the third embodiment. Further, one of the second conductive posts 18b is disposed in each of left and right side positions on outer sides avoiding the short-circuit prevention region As in the inner sub-region SA1. In the intermediate sub-region SA2, one each of the second conductive posts 18b is disposed in positions the same as those of the second conductive posts 18b on the left and right of the inner sub-region SA1, and one of the second conductive posts 18b is disposed in a central position, wherein the total of three second conductive posts 18b are disposed at equal intervals. Furthermore, in the outer sub-region SA3, three of the second conductive posts 18b are disposed at equal intervals in positions the same as those in the intermediate sub-region SA2.

According to the fourth embodiment, the emitter electrode pads 11b of the semiconductor chips 11A and 11B are divided into three sections in a backward direction away from the control electrode pad 11a, forming the inner sub-region SA1, intermediate sub-region SA2, and outer sub-region SA3, and the second conductive posts 18b are disposed in outer positions avoiding the short-circuit prevention region As in each of the sub-regions SA1 to SA3, because of which it is possible to obtain the same operational advantages as in the first and second embodiments. Moreover, as the same number of second conductive posts 18b are disposed in the same plane at equal intervals in the intermediate sub-region SA2 and outer sub-region SA3, it is possible to prevent the bias in the amount of heat generated occurring when the disposition of the second conductive posts 18b is in an uneven state, as in the third embodiment, thus carrying out uniform heat generation. That is, when second conductive posts 18b are disposed in proximity, and the area over which the second conductive posts 18b are joined is large, the resistance of the semiconductor chips 11A and 11B increases when current flows through the semiconductor chips 11A and 11B, the amount of heat generated increases commensurately, and bias occurs in the amount of heat generated.

However, in the fourth embodiment, an equal number of the second conductive posts 18b are disposed at equal intervals in the intermediate sub-region SA2 and outer sub-region SA3, because of which there is no region in the intermediate sub-region SA2 or outer sub-region SA3 in which the value of the resistance caused by the second conductive posts 18b becomes excessive, and it is thus possible to suppress the amount of heat generated. Consequently, it is possible to reduce thermal stress, suppressing connection portion failures (joining material cracks, detachment, semiconductor chip cracks occurring due to solder tensile stress, short-circuits, and the like) caused by differences between the linear expansion coefficients of the second conductive posts 18b and the joining material, such as solder, and semiconductor chips 11A and 11B, and thus increasing reliability.

Figure 9A:
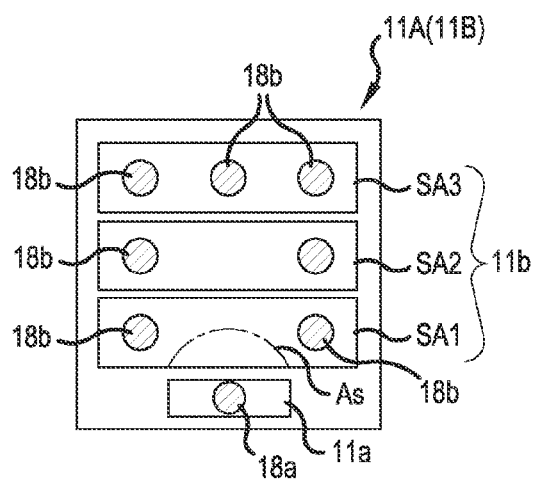
FIG. 9A shows an example wherein the interval between conductive posts in an outer sub-region is set to be small with respect to the interval between conductive posts in an inner sub-region and intermediate sub-region.

Next, a description will be given, accompanying FIG. 9, of a fifth embodiment of the invention. The fifth embodiment is such that the amount of heat generated in the central portions of the semiconductor chips 11A and 11B is suppressed. That is, in the fifth embodiment, as shown in FIG. 9A, the configuration is the same as that of FIG. 8, except that the second conductive post 18b in the left-right direction central portion of the intermediate sub-region SA2 in the configuration of FIG. 8 in the fourth embodiment is omitted. According to the configuration of FIG. 9A, by the second conductive post 18b in the left-right direction central portion of the intermediate sub-region SA2 positioned in the central portions of the semiconductor chips 11A and 11B being omitted, it is possible to further reduce the resistance in the central portion of the intermediate sub-region SA2 when energizing the semiconductor chips 11A and 11B, and thus possible to further suppress the amount of heat generated in the central portions of the semiconductor chips 11A and 11B.

Figure 9B:
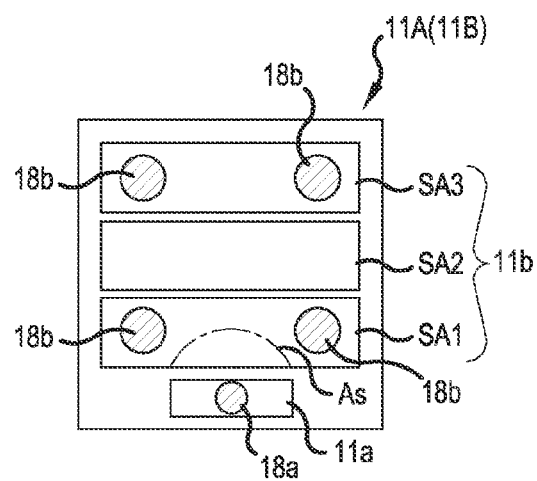
FIG. 9B shows an example wherein the disposition of conductive posts in the intermediate sub-region is omitted.

Furthermore, as shown in FIG. 9B, it is also possible to further suppress the amount of heat generated in the central portions of the semiconductor chips 11A and 11B by one of the second conductive posts 18b, of a large diameter in comparison with that in FIG. 9A, being disposed in left and right side positions in each of the inner sub-region SA1 and outer sub-region SA3, and disposition of the second conductive post in the intermediate sub-region SA2 being omitted. In this case, the energizing amount necessary in the emitter electrode pads 11b of the semiconductor chips 11A and 11B can be generated by the diameter of the second conductive posts 18b being increased. In the third to fifth embodiments, a description has been given of a case wherein each of the sub-regions SA1 to SA3 is formed as a rectangle but, this not being limiting, the sub-regions SA1 to SA3 can be formed in an arc form centered on the first conductive post 18a of the control electrode pad 11a, or formed in a dog-leg form.

Figure 10:
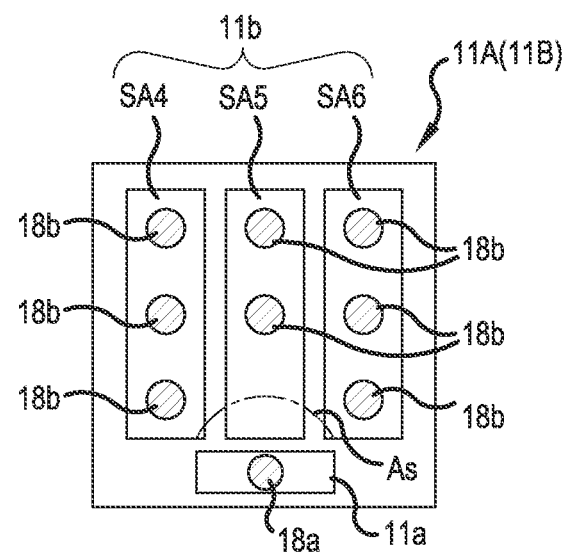
FIG. 10 is a plan view of a semiconductor chip showing a sixth embodiment of the invention.

Next, a description will be given, accompanying FIG. 10, of a sixth embodiment of the invention. In the sixth embodiment, the direction in which the emitter electrode pad is divided is such that the emitter electrode pad is divided in a direction perpendicular to a direction away from the gate electrode pad. That is, in the sixth embodiment, the emitter electrode pads 11b of the semiconductor chips 11A and 11B are divided into, for example, three sections, in a direction perpendicular to the backward direction away from the control electrode pad 11a, forming a left-side sub-region SA4, a center sub-region SA5, and a right-side sub-region SA6, as shown in FIG. 10. Further, three of the second conductive posts 18b are disposed at equal intervals backward from the front side in the left-side sub-region SA4 and right-side sub-region SA6. In the center sub-region SA5, two of the second conductive posts 18b are disposed in the same planes as in the left and right sub-regions SA4 and SA6 on an outer side avoiding the short-circuit prevention region As.

According to the sixth embodiment, the emitter electrode pads 11b of the semiconductor chips 11A and 11B are divided into three sections in a direction perpendicular to the backward direction away from the control electrode pad 11a, forming the left-side sub-region SA4, center sub-region SA5, and right-side sub-region SA6, and the second conductive posts 18b are disposed in outer positions avoiding the short-circuit prevention region As in each of the sub-regions SA4 to SA6, because of which it is possible to obtain the same operational advantages as in the first to fifth embodiments. Moreover, in the sixth embodiment, the second conductive posts 18b are disposed uniformly in each of the sub-regions SA4 to SA6, with no unevenness occurring, because of which it is possible to equalize the amount of heat generated in the semiconductor chips 11A and 11B. In the sixth embodiment, a description has been given of a case wherein two of the second conductive posts 18b are disposed in the center sub-region SA5, but the amount of heat generated in the central portions of the semiconductor chips 11A and 11B may be reduced by the second conductive post 18b in the central position in the center sub-region SA5 being omitted, in the same way as in the fifth embodiment.

Also, in the first to sixth embodiments, a description has been given of a case wherein an insulated gate bipolar transistor (IGBT) is mounted on the semiconductor chips 11A and 11B but, this not being limiting, the invention is also applicable to a case wherein a power MOSFET is mounted. Furthermore, the number and positions of the conductive posts disposed not being limited by the embodiments, the number and positions can be arbitrarily decided based on a diameter and number in accordance with a decrease in relevant modules and semiconductor chips. Also, in the first to sixth embodiments, a description has simply been given of a case wherein the short-circuit prevention region As is provided but, this not being limiting, an isolation layer may be formed on the short-circuit prevention region As.

Figure 11:
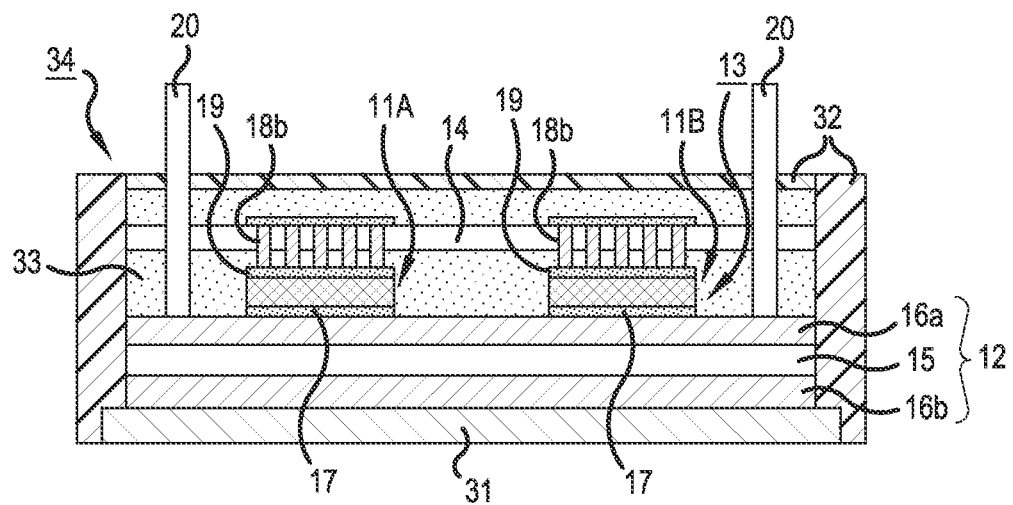
FIG. 11 is a sectional view showing a seventh embodiment of a power semiconductor module as a semiconductor device according to an embodiment of the invention.
Figure 12:
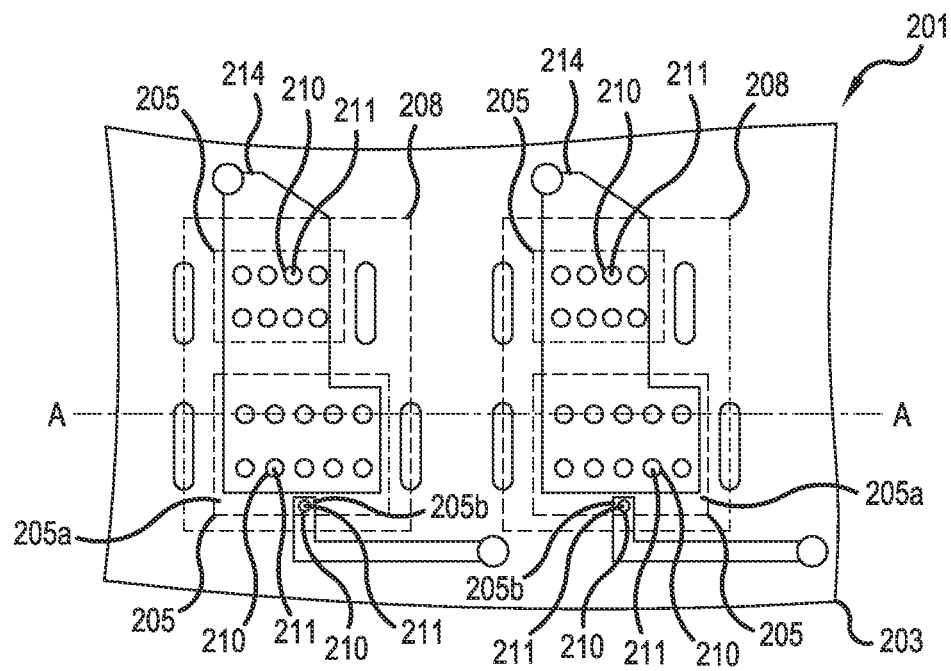
FIG. 12 is a plan view showing an existing example.
Figure 13:
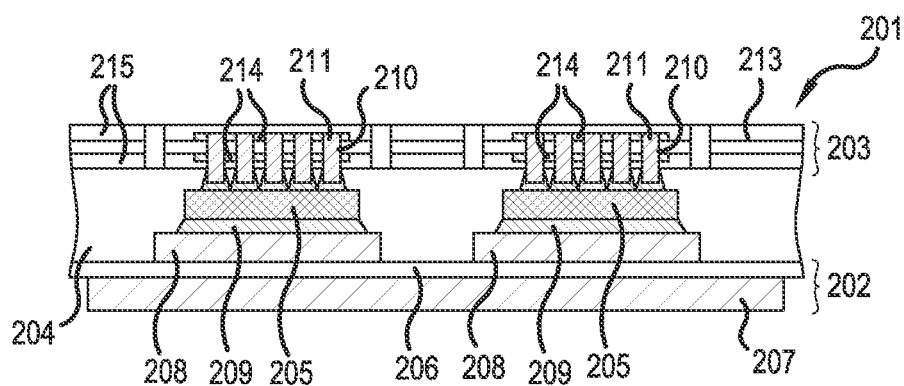
FIG. 13 is a sectional view along line A-A of FIG. 12.

Also, in the first to sixth embodiments, a description has been given of a case wherein the insulating substrate 12 on which the semiconductor chips 11A and 11B are mounted and the printed substrate 14 are molded with the resin sealing material 24. However, the invention, not being limited to the heretofore described configuration, is also applicable to a power semiconductor module 34 having the configuration shown in FIG. 11. That is, the power semiconductor module 34 is such that the insulating substrate 12 on which the semiconductor chips 11A and 11B are mounted is disposed on a metal heat releasing base 31, and the semiconductor chips 11A and 11B and the first conductive posts 18a and second conductive posts 18b formed in the printed substrate 14 are electrically joined by the solder 19. In this joined state, the power semiconductor module 34 is formed by covering with a resin case 32 that encloses the outer sides, and filling the inside of the resin case 32 with a gel-form insulating sealing material 33.

The invention claimed is:

1. A semiconductor device, comprising:
a semiconductor chip;
a first electrode pad and second electrode pad included on the semiconductor chip;
a first conductive post connected to the first electrode pad by a joining material;
a plurality of second conductive posts connected to the second electrode pad by a joining material; and
a printed substrate including an electrical circuit to which the first conductive post and second conductive posts are connected, wherein
the first electrode pad is disposed opposing an intermediate portion of an edge of the second electrode pad, and
the plurality of second conductive posts are arrayed outside a short-circuit prevention region positioned between two of the second conductive posts arrayed on a side of the second electrode pad near the first conductive post, the short-circuit prevention region including a point of intersection of a first imaginary line bisecting the two of the second conductive posts and a second imaginary line, the second imaginary line being perpendicular to the first imagery line and bisecting the first conductive post, and the short-circuit prevention region being free of any second conductive posts.

2. The semiconductor device according to claim 1, wherein the two second conductive posts are arrayed in positions at either end side of the edge of the second electrode pad.

3. The semiconductor device according to claim 1, wherein the plurality of second conductive posts are arrayed in an arc form.

4. The semiconductor device according to claim 3, wherein an interval between the two second conductive posts is greater than the interval between other second conductive posts of the plurality of second conductive posts.

5. The semiconductor device according to claim 1, further comprising an isolation layer disposed on the short-circuit prevention region.

6. The semiconductor device according to claim 2, further comprising an isolation layer disposed on the short-circuit prevention region.

7. The semiconductor device according to claim 3, further comprising an isolation layer disposed on the short-circuit prevention region.

8. The semiconductor device according to claim 4, further comprising an isolation layer disposed on the short-circuit prevention region.

9. The semiconductor device according to claim 1, wherein the second electrode pad is divided into a plurality of sub-regions in a direction away from the first electrode pad, and the plurality of sub-regions are connected by wiring.

10. The semiconductor device according to claim 2, wherein the second electrode pad is divided into a plurality of sub-regions in a direction away from the first electrode pad, and the plurality of sub-regions are connected by wiring.

11. The semiconductor device according to claim 1, wherein the second electrode pad is divided into a plurality of sub-regions perpendicular to a direction away from the first electrode pad, and the plurality of sub-regions are connected by wiring.

12. The semiconductor device according to claim 2, wherein the second electrode pad is divided into a plurality of sub-regions perpendicular to a direction away from the first electrode pad, and the plurality of sub-regions are connected by wiring.

13. The semiconductor device according to claim 1, further comprising an isolation layer disposed on the short-circuit prevention region, wherein an interval between the two second conductive posts is greater than the interval between other second conductive posts of the plurality of second conductive posts.

14. A semiconductor device, comprising:
a semiconductor chip;
a first electrode pad and second electrode pad included on the semiconductor chip, the second electrode pad being divided into a plurality of sub-regions in a direction away from the first electrode pad, the plurality of sub-regions including a first sub-region, a second sub-region, and a third sub-region;
a first conductive post connected to the first electrode pad by a joining material;
a plurality of second conductive posts connected to the second electrode pad by a joining material; and
a printed substrate including an electrical circuit to which the first conductive post and second conductive posts are connected, wherein
the first electrode pad is disposed opposing an intermediate portion of an edge of the first sub-region of the second electrode pad,
the second sub-region of the second electrode pad includes second conductive posts respectively disposed at sides and a central portion of the second sub-region,
the third sub-region of the second electrode pad includes second conductive posts respectively disposed at the sides and the central portion of the third sub-region, and
the first sub-region of the second electrode pad includes second conductive posts respectively disposed at the sides of the first sub-region, the central portion of the first sub-region being free from any second conductive posts.

15. The semiconductor device according to claim 14, wherein
the second sub-region of the second electrode pad includes first and second conductive posts respectively disposed at first and second sides of the second sub-region and a third second conductive post disposed in the central portion of the second sub-region, the third sub-region of the second electrode pad includes fourth and fifth second conductive posts respectively disposed at third and fourth sides of the third sub-region and a sixth second conductive post disposed in the central portion of the third sub-region, and
the first sub-region of the second electrode pad includes seventh and eighth second conductive posts respectively disposed at fifth and sixth sides of the first sub-region, the seventh and eighth second conductive posts being the only second conductive posts disposed in the first sub-region.

* * * * *